US009807516B2

(12) United States Patent
Wang et al.

(10) Patent No.: US 9,807,516 B2
(45) Date of Patent: Oct. 31, 2017

(54) MEMS MICROPHONE PACKAGE

(71) Applicants: Chao Wang, Shenzhen (CN); Bin Xu, Shenzhen (CN)

(72) Inventors: Chao Wang, Shenzhen (CN); Bin Xu, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 13 days.

(21) Appl. No.: 14/832,913

(22) Filed: Aug. 21, 2015

(65) Prior Publication Data

US 2016/0219376 A1    Jul. 28, 2016

(30) Foreign Application Priority Data

Jan. 23, 2015    (CN) .................... 2015 2 0050756 U

(51) Int. Cl.
*H04R 1/04*    (2006.01)
*H04R 19/04*    (2006.01)
*B81B 7/00*    (2006.01)
*H04R 19/00*    (2006.01)

(52) U.S. Cl.
CPC .......... *H04R 19/04* (2013.01); *B81B 7/0064* (2013.01); *H04R 19/005* (2013.01); *B81B 2201/0257* (2013.01); *B81B 2207/012* (2013.01); *H04R 2201/003* (2013.01); *H04R 2209/022* (2013.01)

(58) Field of Classification Search
CPC ... B81B 7/007; B81B 7/0064; B81C 1/00238; H01L 24/17; H01L 25/0657; H04R 19/04; H04R 2201/003
See application file for complete search history.

(56) References Cited

U.S. PATENT DOCUMENTS

| 6,881,896 | B2 * | 4/2005 | Ebihara | H01L 23/552 |
| | | | | 174/546 |
| 8,043,892 | B2 * | 10/2011 | Kwak | H01L 21/561 |
| | | | | 257/659 |
| 9,153,542 | B2 * | 10/2015 | Lin | H01Q 21/065 |
| 2008/0308912 | A1 * | 12/2008 | Cha | H01L 23/29 |
| | | | | 257/659 |
| 2010/0175242 | A1 * | 7/2010 | Wu | H04R 19/005 |
| | | | | 29/594 |
| 2010/0322451 | A1 * | 12/2010 | Wu | H04R 1/086 |
| | | | | 381/369 |
| 2012/0126347 | A1 * | 5/2012 | Yang | B81B 7/0064 |
| | | | | 257/416 |

(Continued)

FOREIGN PATENT DOCUMENTS

CA        2550887 A1 * 12/2006    .............. H04B 15/00

*Primary Examiner* — Latanya N Crawford
(74) *Attorney, Agent, or Firm* — Na Xu; IPro, PLLC

(57) ABSTRACT

A micro-electro-mechanical system (MEMS) microphone package is provided in the present disclosure. The MEMS microphone package includes a circuit board, an electromagnetic shielding cover mounted on the circuit board to define an accommodating space, electronic components received in the accommodating space and electrically connected to the circuit board, and a shielding ring covering a joint between the electromagnetic shielding cover and the circuit board. The shielding ring is configured for preventing electromagnetic waves from entering the accommodating space via the joint between the electromagnetic shielding cover and the circuit board.

10 Claims, 3 Drawing Sheets

(56) References Cited

U.S. PATENT DOCUMENTS

2012/0328142 A1* 12/2012 Horibe .................. H04R 3/005
　　　　　　　　　　　　　　　　　　　　　　　381/355
2013/0322662 A1* 12/2013 Chen .................... H04R 19/005
　　　　　　　　　　　　　　　　　　　　　　　381/174
2014/0035097 A1*  2/2014 Lin ...................... H01Q 21/065
　　　　　　　　　　　　　　　　　　　　　　　257/531
2016/0212517 A1*  7/2016 Liu ......................... H04R 1/04

* cited by examiner

MEMS MICROPHONE PACKAGE

FIELD OF THE DISCLOSURE

The present disclosure generally relates to microphone technologies, and more particular, to a micro-electro-mechanical system (MEMS) microphone package with a high electromagnetic shielding performance.

BACKGROUND

Microphones are applied in various electronic products for converting sound into electrical signals. Compared with other types of microphones, MEMS microphones have some advantages such as small size and low weight, and thus are used widely. However, because a MEMS microphone needs to receive sound in the air, the MEMS microphone is apt to suffer electromagnetic interference of surrounding electromagnetic waves. This may decrease sound reception quality of the MEMS microphone.

Therefore, it is desired to provide a MEMS microphone package which can overcome the aforesaid problems.

BRIEF DESCRIPTION OF THE DRAWINGS

Many aspects of the embodiment can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will be described in detail below with reference to the attached drawings and the embodiment thereof.

Figure 1:
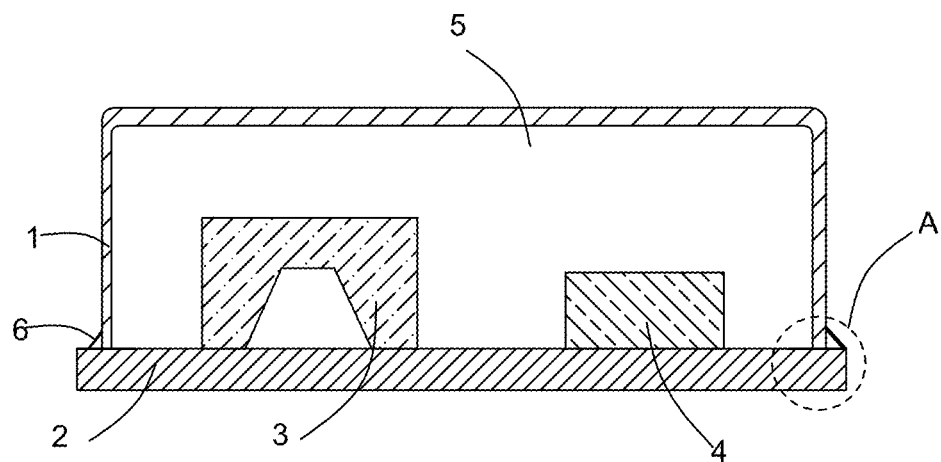
FIG. 1 is a schematic, cross-sectional view of a MEMS microphone package according to a first embodiment of the present disclosure.

FIG. 1 illustrates a MEMS microphone package according to a first embodiment of the present disclosure. The MEMS microphone package is applicable to an electronic apparatus such as a smart phone, a tablet computer, or the like. As illustrated in FIG. 1, the MEMS microphone package includes an electromagnetic shielding cover 1 and a circuit board 2. The circuit board 2 may be a printed circuit board (PCB), such as a plastic PCB, a metal PCB or a flexible printed circuit board (FPCB). The electromagnetic shielding cover 1 is engaged with the circuit board 101 to form an accommodating space 5.

Moreover, the MEMS microphone package further includes a plurality of electronic components received in the accommodating space 5, the electronic components are protected by the electromagnetic shielding cover 1 from suffering electromagnetic interference. The electronic components typically include a MEMS transducer 3 and an integrated circuit (IC) chip 4, which are electrically connected to the circuit board 2. The MEMS transducer 3 is configured to receive sound waves entering the accommodating space 5 and converting the sound waves into electrical signals; the IC chip 4 is configured to perform signal process on the electrical signals and then output the electrical signals to external circuits.

In the present embodiment, the MEMS transducer 3 and the IC chip 4 are both mounted on a main surface of the circuit board 2, however, it should be noted that in other embodiments, at least one of the MEMS transducer 3 and the IC chip 4 may alternatively be disposed on an inner surface of the electromagnetic shielding cover 1.

In practice, the electromagnetic shielding cover 1 may be fixed onto the circuit board 2 via a laser-beam welding process or a spot welding process. However, the welding process may bring undesired concaves, gaps or other deficiencies at a joint between the electromagnetic shielding cover 1 and the circuit board 2, and these undesired deficiencies may decrease an electromagnetic shielding performance of the electromagnetic shielding cover 1.

Figure 2:
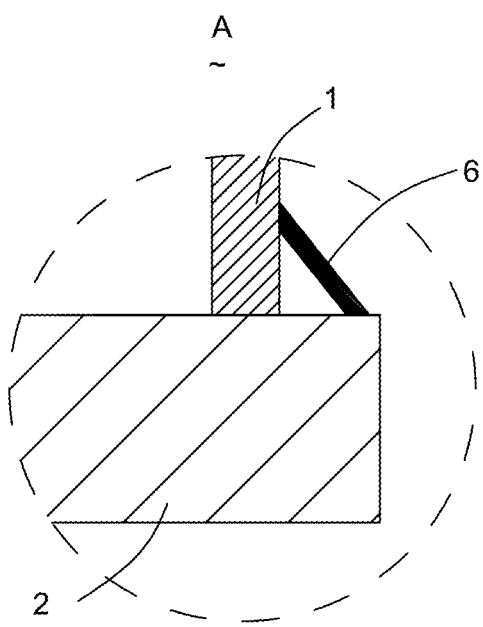
FIG. 2 is an enlarged view of section A of the MEMS microphone package in FIG. 1.

To solve the above-mentioned problem, in the MEMS microphone package as illustrated in FIGS. 1-2, a shielding ring 6 is provided to cover the joint between the electromagnetic shielding cover 1 and the circuit board 2, and the shielding ring 6 is arranged outside the accommodating space 5. The shielding ring 6 is configured to prevent environmental electromagnetic waves from passing through the joint between the electromagnetic shielding cover 1 and the circuit board 2 and entering the accommodating space 5.

Figure 3:
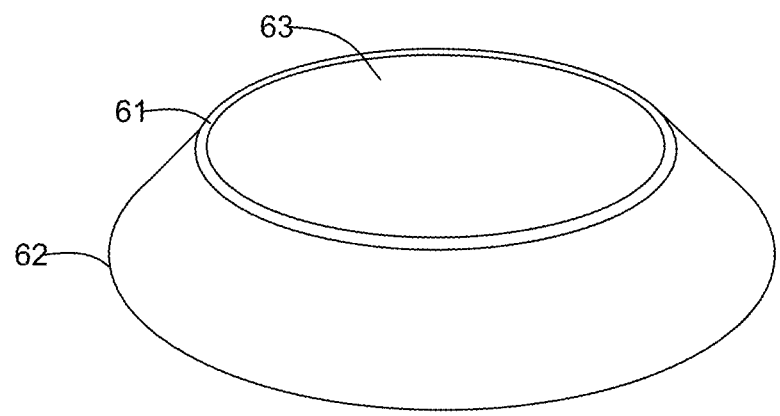
FIG. 3 is a schematic view of a shielding ring of the MEMS microphone package in FIG. 1

Referring also to FIG. 3, in the present embodiment, the shielding ring 6 has an approximate hollow truncated cone structure, which includes a top portion 61 and a bottom portion 62; the top portion 61 has a diameter less than that of the bottom portion 62. Moreover, a through hole 63 is formed at the shielding ring 6 and extends from the top portion 61 to the bottom portion 62. The through hole 63 at the top portion 61 is designed to match an outline of the electromagnetic shielding cover 1, so that the top portion 61 of the shielding ring 6 can be attached onto an outer surface of the electromagnetic shielding cover 1 securely.

For example, the electromagnetic shielding cover 1 may be arranged through the through hole 63 of the shielding ring 6; the top portion 61 and the bottom portion 62 of the shielding ring 6 are hermetically sealed to the outer surface of the electromagnetic shielding cover 1 and the main surface of the circuit board 2 respectively.

Furthermore, both of the electromagnetic shielding cover 1 and the shielding ring 6 may be made of metal, nevertheless, to obtain a better electromagnetic shielding performance, material of the shielding ring 6 may be different from that of the electromagnetic shielding cover 1. At least one of the shielding ring 6 and the electromagnetic shielding cover 1 is grounded via the circuit board 2.

Figure 4:
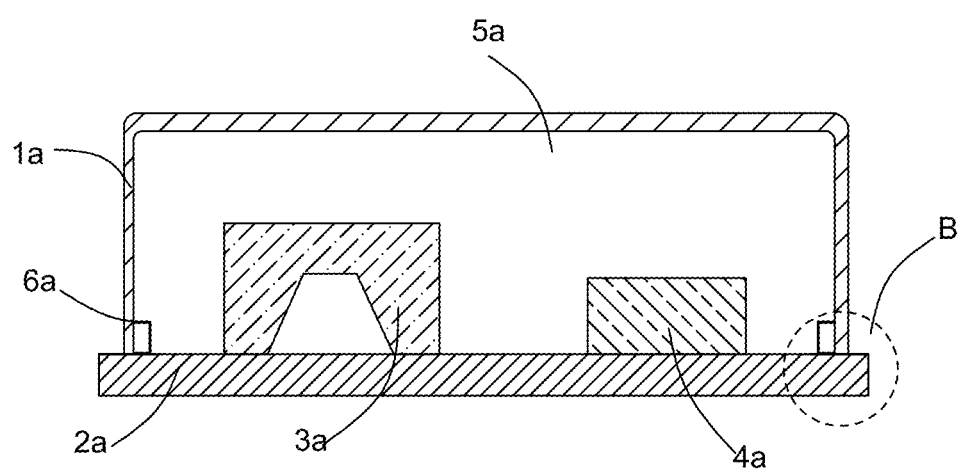
FIG. 4 is a schematic, cross-sectional view of a MEMS microphone package according to a second embodiment of the present disclosure.

FIG. 4 illustrates a MEMS microphone package 200 according to a second embodiment of the present disclosure. The MEMS microphone package 200 is similar to the above-described MEMS microphone package as illustrated in FIG. 1; however, a shielding ring 6a in the MEMS microphone package 200 has a different structure from the shielding ring 6 of the MEMS microphone package in FIG. 1.

Specifically, the MEMS microphone package 200 includes an electromagnetic shielding cover 1a, a circuit board 2a, a MEMS inducer 3a and an IC chip 4a. The electromagnetic shielding cover 1a is engaged with the circuit board 2a to form an accommodating space 5a; the MEMS inducer 3a and the IC chip 4a are mounted on the circuit board 2a and received in the accommodating space 5a. In addition, the MEMS microphone package 200 further includes a shielding ring 6a arranged inside the accommodating space 5a and covering a joint between the electromagnetic shielding cover 1a and the circuit board 2a.

Figure 5:
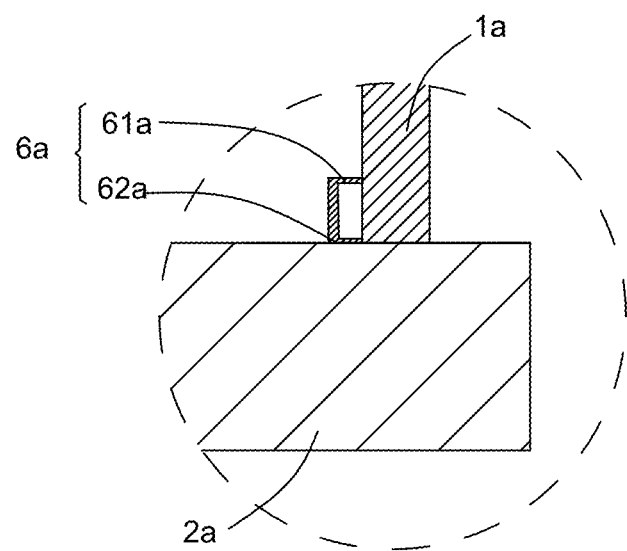
FIG. 5 is an enlarged view of section B of the MEMS microphone package in FIG. 4.

Referring also the FIG. 5, the shielding ring 6a in the present embodiment has an approximate U-shaped cross-section. The shielding ring 6a includes a first extending part 61a and a second extending part 61b extending perpendicularly from two opposite edges of a main wall respectively. The first extending part 61a is perpendicular to an inner surface of the electromagnetic shielding cover 1a, and a distant end of the first extending part 61a is connected and hermetically sealed to the inner surface of the electromagnetic shielding cover 1a. The second extending part 62a is parallel to a main surface of the circuit board 2a, for example, the second extending part 62a may be laid on the main surface of the circuit board 2a, and is connected and hermetically sealed to the circuit board 2a.

Similar to the shielding ring 6 of the MEMS microphone package in FIG. 1, the shielding ring 6a as illustrated in FIG. 2 may also be made of metal material different from the electromagnetic shielding cover 1a, so as to obtain a better electromagnetic shielding protection performance at the joint between the electromagnetic shielding cover 1a and the circuit board 2a.

It should be noted that the shielding ring 6a may alternatively be designed to have other configurations, as long as the shielding ring 6a is capable of covering the joint between the electromagnetic shielding cover 1a and the circuit board 2a. For example, in an alternative embodiment, the shielding ring 6a may have an approximate L-shaped cross-section.

Figure 6:
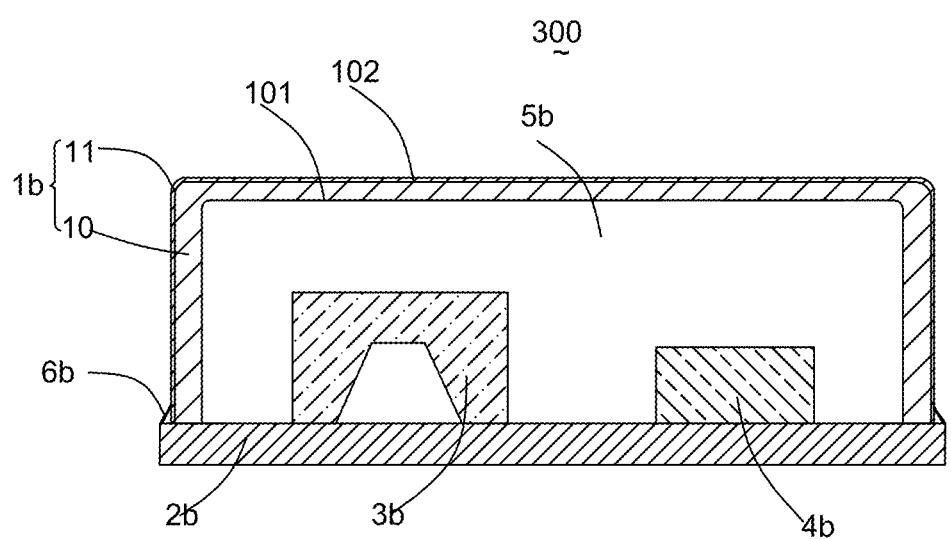
FIG. 6 is a schematic, cross-sectional view of a MEMS microphone package according to a third embodiment of the present disclosure.

FIG. 6 illustrates a MEMS microphone package 300 according to a third embodiment of the present disclosure. The MEMS microphone package 300 is similar to the above-described MEMS microphone package as illustrated in FIG. 1, but mainly differs in that an electromagnetic shielding cover 1b in the MEMS microphone package 300 has a dual layers configuration.

Specifically, the MEMS microphone package 300 includes an electromagnetic shielding cover 1b, a circuit board 2b, a MEMS inducer 3b and an IC chip 4b. The electromagnetic shielding cover 1b is engaged with the circuit board 2b to form an accommodating space 5b; the MEMS inducer 3b and the IC chip 4b are mounted on the circuit board 2b and received in the accommodating space 5b. In addition, the MEMS microphone package 200 further includes a shielding ring 6b arranged outside the accommodating space 5b and covering a joint between the electromagnetic shielding cover 1b and the circuit board 2b.

The electromagnetic shielding cover 1b includes a base cover 10 and a metal layer 11, the base cover 10 may be a non-metal cover such as a plastic cover, and the metal layer 11 is coated on an outer surface of the base cover 10. In other embodiments, the metal layer 11 may alternatively be coated on an inner surface the base cover 10. Moreover, the metal layer 11 is made of material different from the shielding ring 6b, to ensure the shielding ring 6b can provide a better electromagnetic shielding protection performance at the joint between the electromagnetic shielding cover 1b and the circuit board 2b.

In summary, the MEMS microphone packages as provided in the present disclosure use the electromagnetic shielding covers to protect the electronic components in the accommodating space from suffering electromagnetic interference of environmental electromagnetic waves, and moreover, the MEMS microphone packages also uses the shielding rings to prevent the environmental electromagnetic waves from entering the accommodating space via the joints between the circuit boards and the electromagnetic shielding covers, therefore, the MEMS microphone packages can provide better electromagnetic shielding protection performance.

It is to be understood, however, that even though numerous characteristics and advantages of the present embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A micro-electro-mechanical system (MEMS) microphone package, comprising:
   a circuit board;
   an electromagnetic shielding cover mounted on the circuit board to define an accommodating space;
   electronic components received in the accommodating space and electrically connected to the circuit board; and
   a shielding ring covering a joint between the electromagnetic shielding cover and the circuit board, the shielding ring being configured for preventing electromagnetic waves from entering the accommodating space via the joint between the electromagnetic shielding cover and the circuit board; wherein,
   the shielding ring is arranged outside the accommodating space and has a hollow truncated cone structure with a top portion and a bottom portion, and a through hole is formed at the shielding ring and extends from the top portion to the bottom portion; and
   the top portion of the shielding ring has a diameter less than that of the bottom portion of the shielding ring.

2. The MEMS microphone package of claim 1, wherein the electronic components comprise a MEMS transducer for receiving sound waves entering the accommodating space and converting the sound waves into electrical signals.

3. The MEMS microphone package of claim 2, wherein the electronic components comprise an integrated circuit (IC) chip for performing signal process on the electrical signals and then output the electrical signals to external circuits.

4. The MEMS microphone package of claim 1, wherein the through hole at the top portion matches an outline of the electromagnetic shielding cover; the electromagnetic shielding cover is arranged through the through hole of the shielding ring, and the top portion of the shielding ring is sealed to an outer surface of the electromagnetic shielding cover.

5. The MEMS microphone package of claim 4, wherein the bottom portion of the shielding ring is sealed to the circuit board.

6. The MEMS microphone package of claim 1, wherein the shielding ring is made of metal material different from that of the electromagnetic shielding cover.

7. The MEMS microphone package of claim 1, wherein the electromagnetic shielding cover comprises a base cover and a metal layer formed on the base cover, the shielding ring is made of metal material different from that of the metal layer of the electromagnetic shielding cover.

8. The MEMS microphone package of claim 7, wherein the metal layer is formed on an outer surface of the base cover.

9. The MEMS microphone package of claim 7, wherein the metal layer is formed on an inner surface of the base cover.

10. The MEMS microphone package of claim 1, wherein at least one of the electromagnetic shielding cover and the shielding ring is grounded via the circuit board.

* * * * *